(12) United States Patent
Iino

(10) Patent No.: US 11,835,871 B2
(45) Date of Patent: Dec. 5, 2023

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Satoshi Iino, Kuki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 271 days.

(21) Appl. No.: 17/064,171

(22) Filed: Oct. 6, 2020

(65) Prior Publication Data
US 2021/0132516 A1    May 6, 2021

(30) Foreign Application Priority Data
Oct. 30, 2019  (JP) ................. 2019-197745

(51) Int. Cl.
| G03F 9/00 | (2006.01) |
| B29C 59/02 | (2006.01) |
| G03F 7/00 | (2006.01) |
| B29C 35/08 | (2006.01) |

(52) U.S. Cl.
CPC ........... G03F 9/7042 (2013.01); B29C 35/08 (2013.01); B29C 59/02 (2013.01); G03F 7/0002 (2013.01)

(58) Field of Classification Search
None
See application file for complete search history.

(56) References Cited

U.S. PATENT DOCUMENTS

| 8,768,665 B2 | 7/2014 | Veeraraghavan |
| 9,594,301 B2 | 3/2017 | Hayashi |
| 9,993,962 B2 | 6/2018 | Cherala |

(Continued)

FOREIGN PATENT DOCUMENTS

| JP | 2009239274 A | 10/2009 |
| JP | 2013102132 A | 5/2013 |

(Continued)

*Primary Examiner* — Robert J Grun
(74) *Attorney, Agent, or Firm* — ROSSI, KIMMS & McDOWELL LLP

(57) ABSTRACT

An imprint apparatus which is advantageous in improving the accuracy of alignment of a mold and a substrate without reducing productivity is provided.

An imprint apparatus that forms a pattern in an imprint material positioned on a substrate by bringing the imprint material and a mold into contact with each other includes a measurement unit which measures a partial surface shape of a predetermined partial shot region of the substrate, a control unit which acquires a correction amount for relative positional deviations of the substrate and the mold which occur while the imprint material and the mold are brought into contact with each other, on the basis of the partial surface shape of the predetermined partial shot region which is measured by the measurement unit, and a shape correction unit which corrects a shape of at least one of the substrate and the mold on the basis of the correction amount, and the control unit acquires the correction amount for the other shot regions of the substrate on the basis of the partial surface shape of the predetermined partial shot region which is measured by the measurement unit.

13 Claims, 8 Drawing Sheets

(56) References Cited

U.S. PATENT DOCUMENTS

| | | | | |
|---|---|---|---|---|
| 2010/0002218 A1* | 1/2010 | Kosugi | ................ | G03F 9/7034 |
| | | | | 355/77 |
| 2016/0193758 A1* | 7/2016 | Fujimoto | .............. | G03F 7/0002 |
| | | | | 264/40.5 |
| 2020/0086534 A1* | 3/2020 | Okada | ..................... | B29C 43/58 |

FOREIGN PATENT DOCUMENTS

| JP | 2013110398 A | 6/2013 |
|---|---|---|
| JP | 2013527972 A | 7/2013 |
| JP | 2016063219 A | 4/2016 |
| JP | 2017050428 A | 3/2017 |
| JP | 2019149415 A | 9/2019 |

* cited by examiner

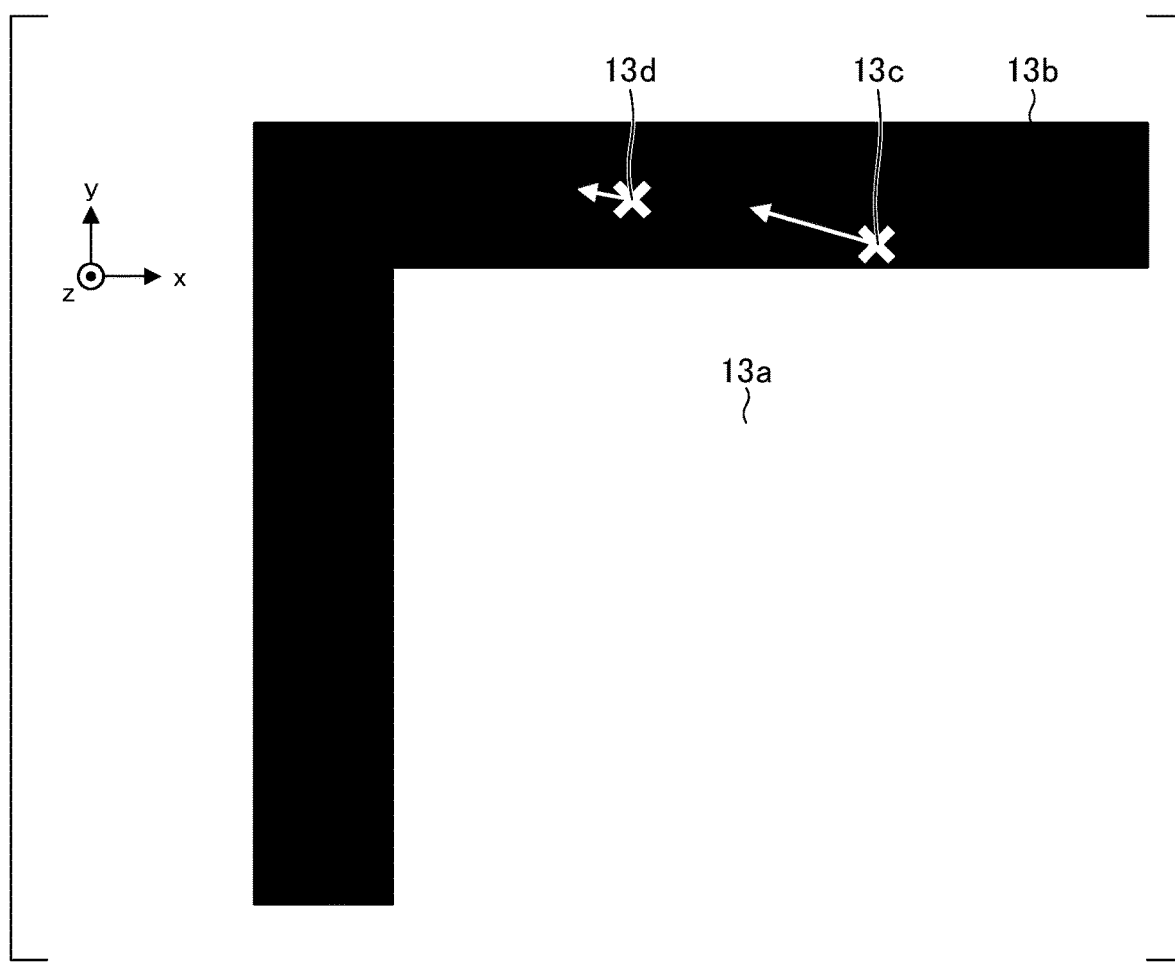

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint technique is a technique for enabling the transfer of nanoscale fine patterns and has been proposed as one of nanolithography techniques for mass production of devices such as semiconductor devices and magnetic storage media. An imprint apparatus using an imprint technique forms a pattern on a substrate by curing an imprint material in a state where a mold in which a pattern is formed and the imprint material positioned on the substrate are brought into contact with each other and separating the mold from the cured imprint material. In this case, as a resin curing method, a photocuring method for curing a resin by irradiation with light such as ultraviolet rays is generally adopted.

In an imprint apparatus, it is necessary to transfer a pattern of a mold with high accuracy with respect to a pattern on a substrate (or a shot region of the substrate) in order to maintain the performance of the device. As a method of performing alignment of a mold and a substrate, die-by-die alignment is generally adopted. The die-by-die alignment is an alignment method for detecting a mark provided on a mold and a mark provided on a substrate to correct positional deviations of the mold and the substrate for each shot region of the substrate. However, the surface of a substrate used for the manufacture of a semiconductor device or the like may have a level difference shape. When imprinting is performed on the substrate having a level difference, the mold is deformed due to the level difference of the substrate, and thus there is a possibility that relative positional deviations (distortions) of the substrate and the mold will occur in a horizontal direction.

In order to cope with such a positional deviation, Published Japanese Translation No. 2013-527972 of the PCT International Publication discloses a method of measuring a nanotopography of a substrate and predicting and correcting a deformation amount of the substrate from data thereof and a positional deviation of the substrate based on the deformation amount. Japanese Unexamined Patent Application, First Publication No. 2016-63219 discloses a method of individually acquiring shape information of each of a substrate and a mold in advance and correcting relative positional deviations of the substrate and the mold in a horizontal direction on the basis of the information at the time of die-by-die alignment.

The degree of a level difference of a substrate may vary depending on an individual substrate. For this reason, it is also possible to acquire data serving as a correction amount calculation source (a level difference shape, a positional deviation amount in a horizontal direction generated due to the level difference shape, and the like) inside the device or by an external measuring apparatus for each substrate. However, such a method generally requires a very long time and significantly reduces the productivity of the imprint apparatus, which is not practical.

Further, in Published Japanese Translation No. 2013-527972 of the PCT International Publication, it is premised that nanotopography information of the entire substrate is acquired, and it is possible to imagine that it takes time to acquire the information. Thus, the necessity of efficiently calculating a correction value for each substrate is not assumed. Additionally, in Japanese Unexamined Patent Application, First Publication No. 2016-63219, shape information of each of a substrate and a mold is individually acquired, and a deviation of a relative position of each of the substrate and the mold is corrected. Since a step of acquiring the shape of each of the substrate and the mold is performed in parallel with imprint processing, productivity is not affected, but positional deviations of the substrate and the mold occurring due to irregularities of the substrate are not mentioned.

SUMMARY OF THE INVENTION

The present invention provides, for example, an imprint apparatus which is advantageous in improving the accuracy of alignment of a mold and a substrate without reducing productivity.

In order to solve the above-described problem, the present invention provides an imprint apparatus that forms a pattern in an imprint material positioned on a substrate by bringing the imprint material and a mold into contact with each other, the imprint apparatus including a measurement unit configured to measure a partial surface shape of a predetermined partial shot region of the substrate, a control unit configured to acquire a correction amount for relative positional deviations of the substrate and the mold which occur while the imprint material and the mold are brought into contact with each other, based on the partial surface shape of the predetermined partial shot region which is measured by the measurement unit, and a shape correction unit configured to correct a shape of at least one of the substrate and the mold based on the correction amount, in which the control unit acquires the correction amount for the other shot regions of the substrate based on the partial surface shape of the predetermined partial shot region which is measured by the measurement unit.

Further features of the present invention will become apparent from the following description of exemplary embodiments with reference to the attached drawings.

BRIEF DESCRIPTION OF THE DRAWINGS

FIG. 5 is a diagram showing an example of coordinates of an evaluation point.

DESCRIPTION OF THE EMBODIMENTS

Hereinafter, preferred embodiments of the present invention will be described in detail on the basis of the accompanying drawings.

Figure 1:
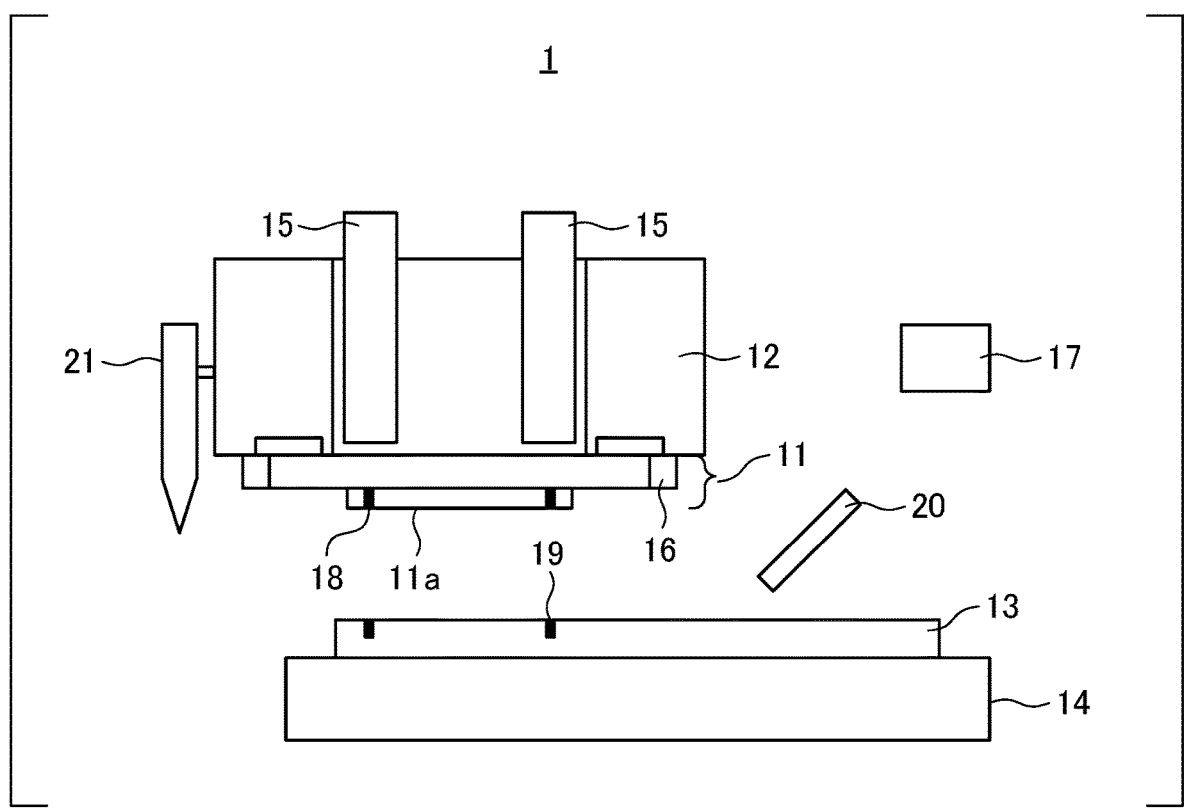
FIG. 1 is a schematic view showing a configuration of an imprint apparatus 1 according to an aspect of the present invention.

FIG. 1 is a schematic view showing a configuration of an imprint apparatus 1 according to an aspect of the present invention. The imprint apparatus 1 is a lithography device that forms a pattern using a mold in an imprint material positioned on a substrate that is, forms the pattern on the substrate by molding the imprint material positioned on the substrate using the mold.

As the imprint material, a curable composition (may be referred to as an uncured resin) which is cured by the application of energy for curing is used. As the energy for curing, electromagnetic waves, heat, and the like may be used. The electromagnetic waves may be, for example, light which is selected from a range of a wavelength between 10 nm to 1 mm such as infrared rays, visible rays, or ultraviolet rays. The curable composition may be a light curable composition which is cured by irradiation with light. Alternatively, the curable composition may be a thermosetting composition which is cured by heating or a thermoplastic composition which is cured by cooling. Among these, the light curable composition may contain at least a polymerizable compound and a photopolymerization initiator, and may further contain a non-polymerizable compound or a solvent as necessary. The non-polymerizable compound is at least one type which is selected from a group consisting of a sensitizer, a hydrogen donor, an internal release agent, a surfactant, an antioxidant, a polymer component, and the like. In the present embodiment, an example in which a light curable composition is used as an imprint material will be described.

The imprint material may be disposed on the substrate in the form of liquid drops or in the form of an island or a film formed by connecting a plurality of liquid drops. Alternatively, the imprint material may be applied onto or disposed on the substrate by a method such as a spin-coat method, a slit-coating method, or a screen-printing method. The viscosity of the imprint material (a viscosity at 25° C.) may be, for example, 1 mPa-s or more and 100 mPa-s or less.

In the present specification and the accompanying drawings, directions are shown in an XYZ coordinate system in which a direction parallel to the surface of a substrate 13 is set to be an XY plane, and thickness directions of the substrate 13 and a mold 11 are set to be a Z-axis. The imprint apparatus 1 includes a mold holding portion 12 that holds the mold 11, a substrate holding portion 14 that holds the substrate 13, a measurement unit 15, a shape correction unit 16, and a control unit 17. In addition, the imprint apparatus 1 includes a supply unit 21 including a dispenser for supplying an imprint material onto the substrate. The imprint material supplied onto the substrate may be used not only to transfer a pattern of the mold onto the substrate but also to correct distortions of the substrate and the mold by controlling a thickness distribution of an imprint material. Further, the imprint apparatus 1 includes a bridge surface plate for holding the mold holding portion 12, a base surface plate for holding the substrate holding portion 14, and the like.

The exterior of the mold 11 has a rectangular shape, and the mold 11 has a pattern surface 11a in which a pattern (concavo-convex pattern) to be transferred onto (an imprint material on) the substrate 13 is formed. The mold 11 is formed of a material transmitting ultraviolet rays for curing the imprint material on the substrate, for example, quartz or the like. In addition, a mold-side mark 18 is formed on the pattern surface 11a of the mold 11.

The mold holding portion 12 is a holding mechanism for holding the mold 11. The mold holding portion 12 includes, for example, a mold chuck that vacuum-suctions or electrostatically suctions the mold 11, a mold stage on which the mold chuck is placed, and a driving system that drives (moves) the mold stage. Such a driving system drives the mold stage (that is, the mold 11) in at least the z-axis direction (an imprinting direction when the mold 11 is imprinted on a resin on the substrate). In addition, such a driving system may have a function of driving the mold stage not only in the z-axis direction but also in the x-axis direction, the y-axis direction, and a θ-direction (rotation around the z-axis).

The substrate 13 is a substrate to which the pattern of the mold 11 is transferred, and for example, glass, ceramics, a metal, a semiconductor, a resin, and the like may be used as the material of the substrate 13. A member formed of a material different from that of the substrate may be provided on the surface of the substrate as necessary. The substrate 13 may include, for example, a single crystal silicon substrate, a silicon on insulator (SOI) substrate, and the like. An imprint material may be supplied (applied) to the substrate 13 from the supply unit 21. Meanwhile, the imprint material may be supplied (applied) or disposed on the substrate 13 outside the imprint apparatus 1 by a method such as a spin-coat method, a slit-coating method, or a screen-printing method. In addition, a substrate-side mark 19 is formed in each of a plurality of shot regions of the substrate 13. Here, the shot region is a region on which the pattern of the imprint material is formed.

The substrate holding portion 14 is a holding mechanism that holds the substrate 13. The substrate holding portion 14 includes, for example, a substrate chuck that vacuum-suctions or electrostatically suctions the substrate 13, a substrate stage on which the substrate chuck is placed, and a driving system that drives (moves) the substrate stage. Such a driving system drives the substrate stage (that is, the substrate 13) in at least the x-axis direction and the y-axis direction (a direction perpendicular to an imprinting direction of the mold 11). In addition, such a driving system may have a function of driving the substrate stage not only in the x-axis direction and the y-axis direction but also in the z-axis direction and a θ-direction (rotation around the z-axis).

The measurement unit 15 includes a scope for optically detecting (observing) the mold-side mark 18 provided on the mold 11 and the substrate-side mark 19 provided on each of a plurality of shot regions of the substrate 13. The measurement unit 15 measures relative positions (positional deviations) of the mold 11 and the substrate 13 on the basis of detection results of the scope. However, the measurement unit 15 only needs to be able to detect a relative positional relationship between the mold-side mark 18 and the substrate-side mark 19. Accordingly, the measurement unit 15 may include a scope including an optical system for simultaneously imaging two marks, or may include a scope that detects a signal in which a relative positional relationship such as interference signals or a moire of the two marks is reflected. In addition, the measurement unit 15 may not be able to simultaneously detect the mold-side mark 18 and the substrate-side mark 19. For example, the measurement unit 15 may detect a relative positional relationship between the mold-side mark 18 and the substrate-side mark 19 by obtaining the position of each of the mold-side mark 18 and the substrate-side mark 19 with respect to a reference position disposed therein.

Figure 2:
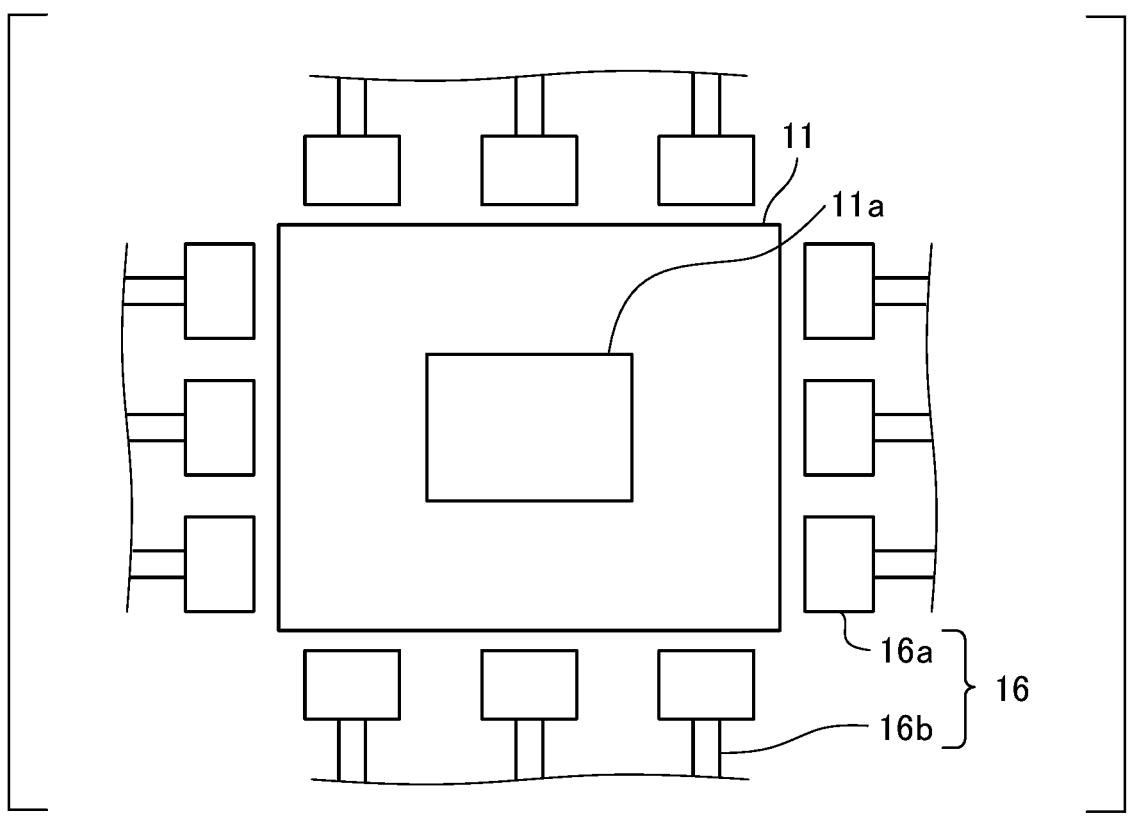
FIG. 2 is a diagram showing an example of a configuration of a shape correction unit.

The shape correction unit 16 functions as a correction unit that corrects a difference in shape between the pattern of the mold 11 and the shot region of the substrate 13 for each shot region of the substrate 13. That is, the shape correction unit 16 corrects the shape of at least one of the substrate 13 and the mold 11. In the present embodiment, the shape correction unit 16 deforms the mold 11 (pattern surface 11a) by applying a force to the mold 11 in a direction parallel to the pattern surface 11a to correct the shape of the pattern surface 11a. FIG. 2 is a diagram showing an example of a configuration of a shape correction unit. For example, as shown in FIG. 2, the shape correction unit 16 includes a suction unit 16a that suctions the side surface of the mold 11 and an actuator 16b that drives the suction unit 16a in a direction toward the side surface of the mold 11 and a direction away from the side surface of the mold 11. The suction unit 16a may not have a function of suctioning the side surface of the mold 11 and may be a contact member that comes into contact with the side surface of the mold 11. In addition, the shape correction unit 16 may deform the pattern surface 11a by controlling the temperature of the mold 11 by applying heat to the mold 11. Further, thermal expansion of the substrate 13 may be locally performed by irradiating a predetermined position on the substrate with light having a fixed intensity to correct the shape of the shot region (a pattern formed in the substrate 13) of the substrate 13 instead of deforming the pattern surface 11a of the mold 11. In this case, it is preferable that the light used to correct the shape be light different from light for curing an imprint material. In this case, the imprint apparatus 1 includes a heat supply unit for supplying heat to the mold 11 or the substrate 13 as a shape correction unit.

The control unit 17 includes a CPU, a memory, and the like and controls the entire imprint apparatus 1 (each unit of the imprint apparatus 1). In the present embodiment, the control unit 17 controls imprint processing and processing related to the imprint processing. For example, the control unit 17 performs alignment of the mold 11 and the substrate 13 on the basis of measurement results of the measurement unit 15 when imprint processing is performed. In addition, the control unit 17 calculates and controls the amount of deformation of the pattern surface 11a of the mold 11 which is performed by the shape correction unit 16 and heat to be supplied to the mold 11 or the substrate 13 when imprint processing is performed. Further, the control unit 17 calculates and controls a density distribution of an imprint material required to correct positional deviations of the substrate and the mold.

An acquisition unit 20 scans the surface of the substrate and acquires information on a level difference shape of the substrate. A correction value for the correction of a shape is changed for each substrate on the basis of level difference information acquired for each substrate. The acquisition unit 20 may be a non-contact type optical sensor or may be any of other types of sensors which are capable of measuring a level difference and by which the same effects as those of the non-contact type optical sensor are obtained.

Example 1

Figure 3:
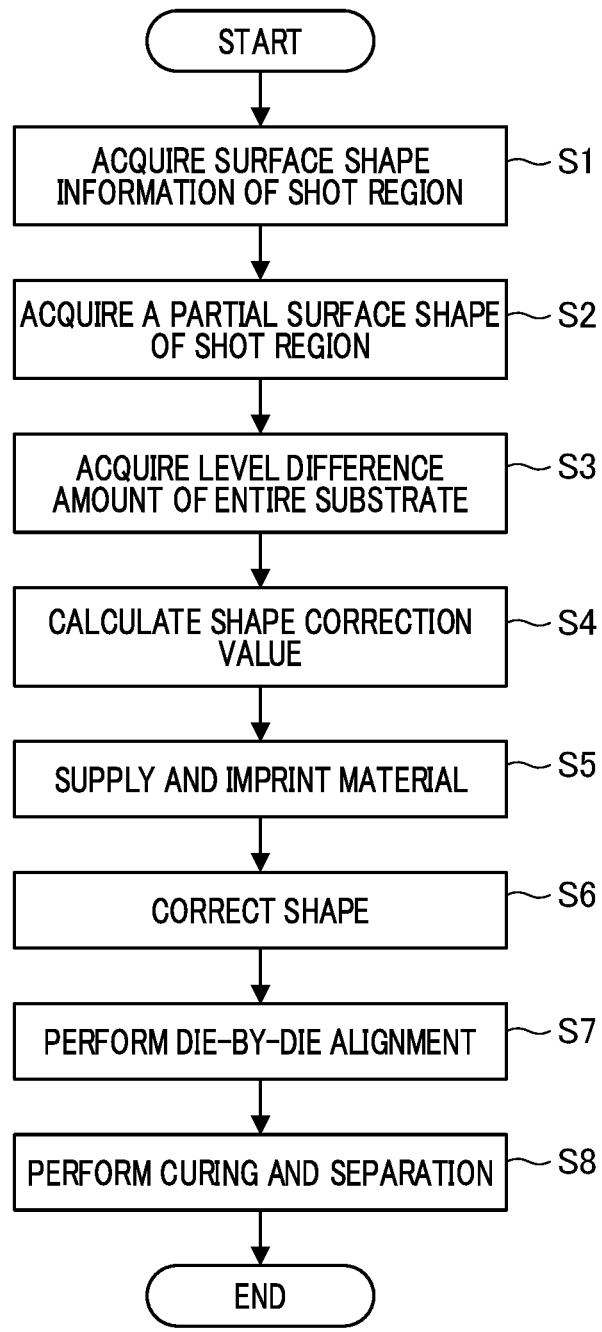
FIG. 3 is a flowchart showing processing according to Example 1.
Figure 4A:
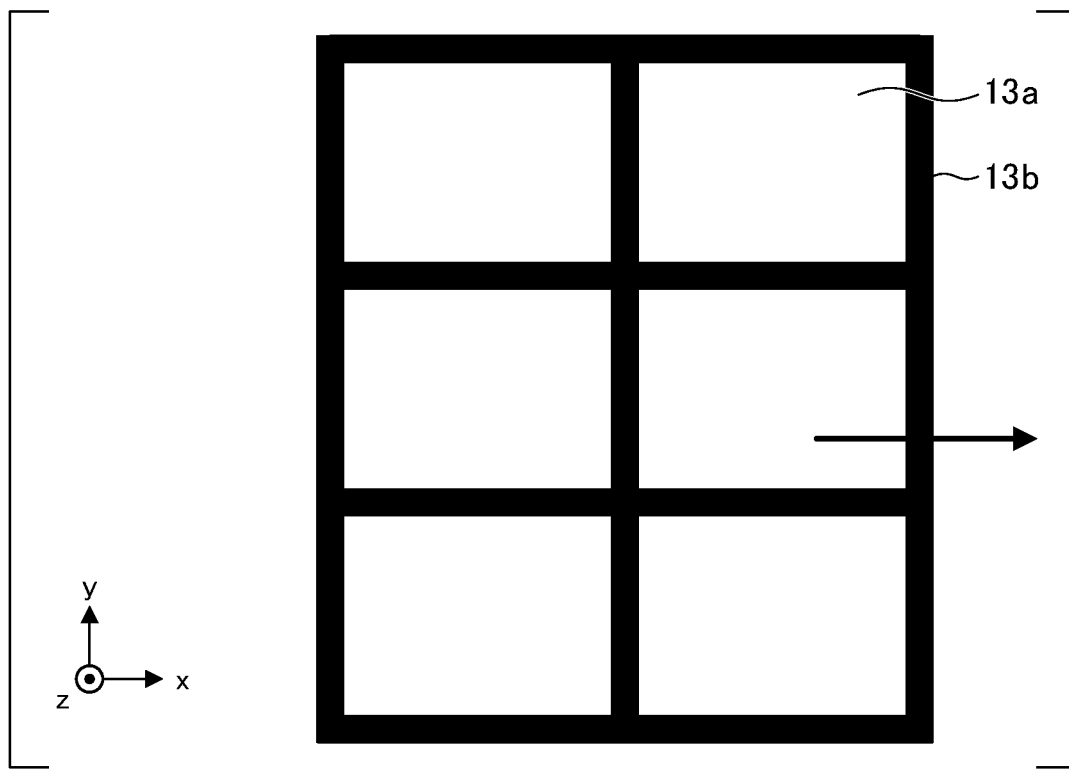
FIGS. 4A and 4B are diagrams showing an example of a level difference shape of a shot region.
Figure 4B:
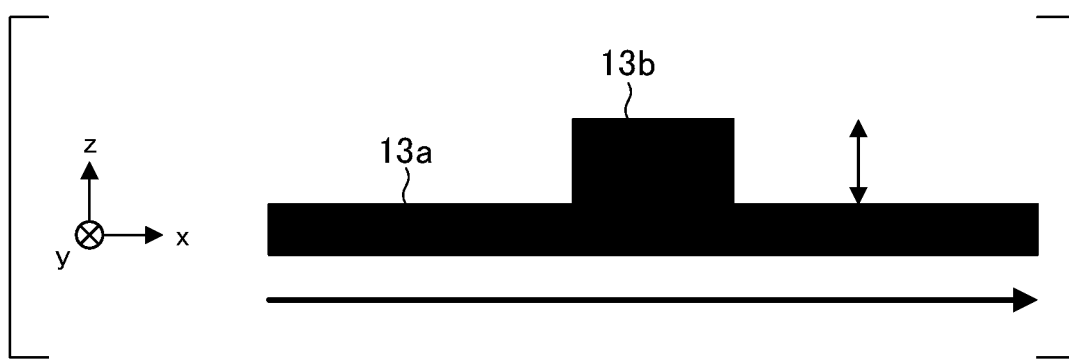

FIG. 3 is a flowchart showing processing according to Example 1. Operations (steps) shown in the flowchart may be executed by the control unit 17 controlling each unit. In the present example, a positional deviation between the mold 11 and the substrate 13 is corrected by acquiring a surface level difference amount of the entire surface on the basis of a surface shape of only a portion of a shot region. In S1, the control unit 17 acquires surface shape information of the entirety of a certain one shot region of the substrate prepared in advance. Each shot region may have irregularities (level difference shape) due to various factors. FIG. 4 is a diagram showing an example of a level difference shape of a shot region. FIG. 4A shows a state where a level difference shape 13b is disposed in a grid shape with respect to a pattern surface 13a of the substrate. FIG. 4B shows the height of the level difference shape 13b in the z-direction in a case where the acquisition unit 20 scans in a direction indicated by an arrow in the drawing. The surface shape information may include information indicating the irregularities. Since the irregularities have a predetermined tendency, a level difference shape of the entirety of a certain one shot region of the substrate is acquired as the surface shape information in advance, for example, by the acquisition unit 20, an external measuring apparatus, or the like. Meanwhile, in a case where a level difference shape of the entirety of a certain one shot region of the substrate or the entire substrate can be acquired by simulation or an experiment, the level difference shape may be acquired in order to be used as surface shape information. Meanwhile, surface shape information may be acquired on the basis of level difference shapes of a plurality of shot regions. In this case, for example, surface shape information generated on the basis of standard deviations of the level difference shapes of the plurality of shot regions is used.

Referring back to FIG. 3, in S2, a partial surface shape of a shot region is acquired by the acquisition unit 20. In this case, a portion of the shot region for acquiring a surface shape by the acquisition unit 20 is required to be a portion having a level difference. Consequently, the control unit 17 determines a portion in the shot region whose surface shape is to be measured on the basis of the surface shape information acquired in S1, and the acquisition unit 20 acquires a level difference amount of the portion determined by the control unit 17.

In S3, the control unit 17 acquires a surface level difference amount of the entire substrate by performing calculation such as an interpolation operation on the basis of the partial surface shape acquired in S2. S2 may be performed in only a certain one shot of the substrate or may be performed in a plurality of shots. In the former case, in S3, the control unit 17 calculates a level difference amount of the entire substrate on the assumption that a level difference amount of one shot on which level difference measurement has been performed is common to all shots. In the latter case, a level difference amount distribution within the substrate is estimated from acquired level difference information of a plurality of points by linear interpolation or the like. In addition, a level difference amount acquired in one shot region may be only a certain portion of the shot region, or information of a plurality of points of the shot region may be acquired. In the former case, a level difference amount of the entire substrate is calculated on the assumption that the acquired one level difference amount is common to all of the shots. In the latter case, a level difference amount distribution within a shot is estimated from the acquired level difference information of the plurality of points by linear interpolation or the like. As described above, a surface level difference amount of the entire substrate is estimated from the acquired partial level difference information. Regardless of how S2 is performed, only a partial level difference amount of the substrate is measured, and thus it is possible to acquire level difference information of the entire substrate while hardly affecting the productivity of the imprint apparatus.

In S4, the control unit 17 calculates relative positional deviations of the substrate 13 and the mold 11 which occur while the imprint material on the substrate and the mold 11 are brought into contact with each other and correction amounts (shape correction values) for the relative positional deviations, on the basis of the level difference amount of the entire substrate which is acquired in S3. The positional deviations to be corrected here are high-order components other than low-order components, such as translation, magnification, and rotation, which are corrected by die-by-die alignment in S7 to be described later.

Further, in S4, information of coordinates of an evaluation point measured by the external measuring apparatus is considered. FIG. 5 is a diagram showing an example of coordinates of an evaluation point. Evaluation points are disposed on the level difference shape 13b and are measured by the external measuring apparatus. An evaluation point 13c is close to a boundary between the pattern surface 13a and the level difference shape 13b of the substrate, and an evaluation point 13d is further from the boundary than the evaluation point 13c. Arrows extending from the respective evaluation points represent relative positional deviations of the substrate 13 and the mold 11 which occur at the time of imprinting (when an imprint material on the substrate and the mold 11 come into contact with each other), and a larger positional deviation is indicated by a longer arrow. It can be understood that the positional deviation becomes larger as a distance to a level difference boundary decreases. Accordingly, the control unit 17 includes, for example, a storage unit and stores the amount of positional deviation in the entirety of a shot region measured in advance and coordinates on a shot region at each of points where the amount of positional deviation has been measured in the storage unit. In addition, when a correction amount of a positional deviation is calculated, the control unit 17 calculates a positional deviation occurring at coordinates of an evaluation point measured by the external measuring apparatus to calculate the correction amount so that the positional deviation at the evaluation point is minimized.

Figure 6A:
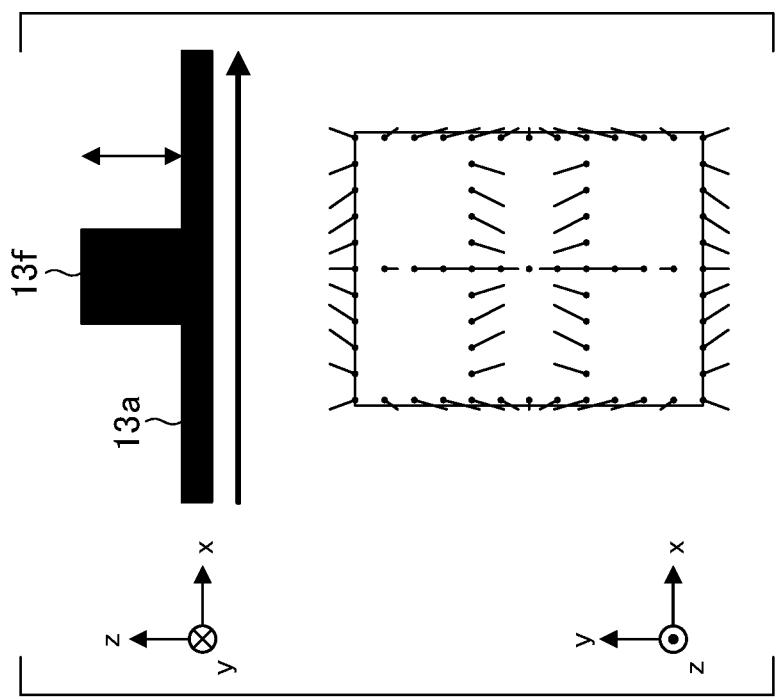
FIGS. 6A and 6B are diagrams showing a relationship between a level difference amount and a positional deviation.
Figure 6B:
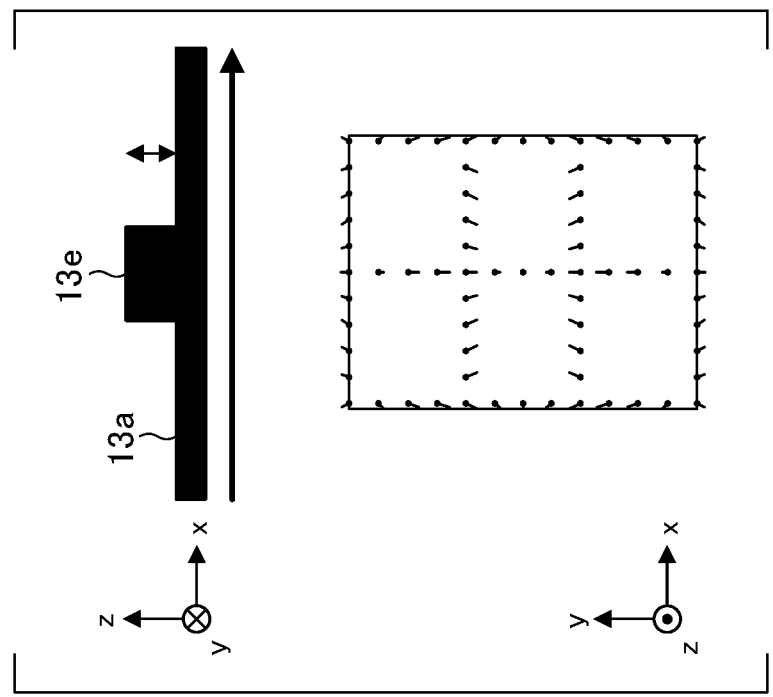

FIG. 6 is a diagram showing a relationship between a level difference amount and a positional deviation. This drawing shows a state where a positional deviation occurring due to a level difference shape changes depending on a level difference amount in a certain shot region. FIG. 6A shows a certain level difference shape 13e and positional deviations of a substrate and a mold which occur when imprinting is performed on the substrate having the level difference shape 13e. FIG. 6B shows a level difference shape 13f having a level difference larger than that of the level difference shape 13e and a positional deviation occurring when imprinting is performed on a substrate having the level difference shape 13f, and it indicates that a positional deviation that occurs becomes larger as a level difference amount increases. It can be understood that a relationship between the level difference amount and the amount of positional deviation occurring changes linearly.

In S4 shown in FIG. 3, coordinates information of an evaluation point at which a positional deviation is desired to be corrected and a relationship between a level difference amount acquired by simulation or a preliminary experiment and a positional deviation are recorded in advance in, for example, a storage unit or the like. Thereby, it is possible to calculate a positional deviation in the entire substrate which occurs at the time of imprinting from the partial level difference amount of the shot region which is acquired in S2.

In S5, an imprint material is disposed on the substrate by the supply unit 21 including a dispenser. Thereafter, the mold holding portion 12 descends, and the mold 11 is pressed against the imprint material on the substrate 13. In this case, the substrate holding portion 14 may ascend toward the mold holding portion 12, or both the substrate holding portion 14 and the mold holding portion 12 may be driven to bring the mold 11 and the imprint material on the substrate 13 into contact with each other.

In S6, shape correction is performed on the mold 11 and the substrate 13 on the basis of the correction value calculated in S4. The shape correction unit 16 deforms the mold 11 into a desired shape by each shaft being pressed against the side surface of the mold 11. In addition, the heat supply unit irradiates a predetermined position on the mold or the substrate with light having a fixed intensity. Thus, thermal expansion of the mold 11 or the substrate 13 occurs locally, thereby changing relative positions of the mold 11 and the substrate 13 into a desired shape. For a specific method for the shape correction which is performed in S6, refer to Japanese Unexamined Patent Application, First Publication No. 2013-102132.

In S7, the measurement unit 15 optically detects the mold-side mark 18 provided on the mold 11 and the substrate-side mark 19 provided on the shot region of the substrate 13 and measures relative positional deviations of the mold 11 and the substrate 13. The substrate holding portion 14 performs alignment (die-by-die alignment) of the mold 11 and the substrate 13 by driving a substrate stage on the basis of positional deviation information measured by the measurement unit 15. The positional deviations to be corrected here are low-order components, such as translation, magnification, and rotation.

In S8, the imprint material is cured by irradiating the imprint material on the substrate 13 with energy for curing (here, ultraviolet rays). Thereafter, the mold holding portion 12 ascends, and the imprint material on the substrate 13 and the mold 11 are separated from each other, whereby an irregular pattern drawn in the pattern surface 11a of the mold 11 is formed as a pattern of the imprint material on the substrate.

By going through the above-described steps, the positional deviations can be efficiently corrected without measuring a surface level difference amount of the entire substrate for each of substrates having different level difference amounts. In addition, it is possible to improve the accuracy of alignment of the mold and the substrate without deteriorating productivity.

Example 2

In the following description, only differences from Example 1 will be described on the basis of the flowchart shown in FIG. 3. In the present example, positional deviations of the substrate and the mold are corrected using a distribution of an imprint material supplied onto the substrate. Specifically, the density of the imprint material disposed, that is, the thickness of the imprint material, is distributed to correct positional deviations of the substrate and the mold. Thereby, the pattern surface 11a of the mold 11 is deformed to offset distortion, and the positional deviations are corrected.

Figure 7A:
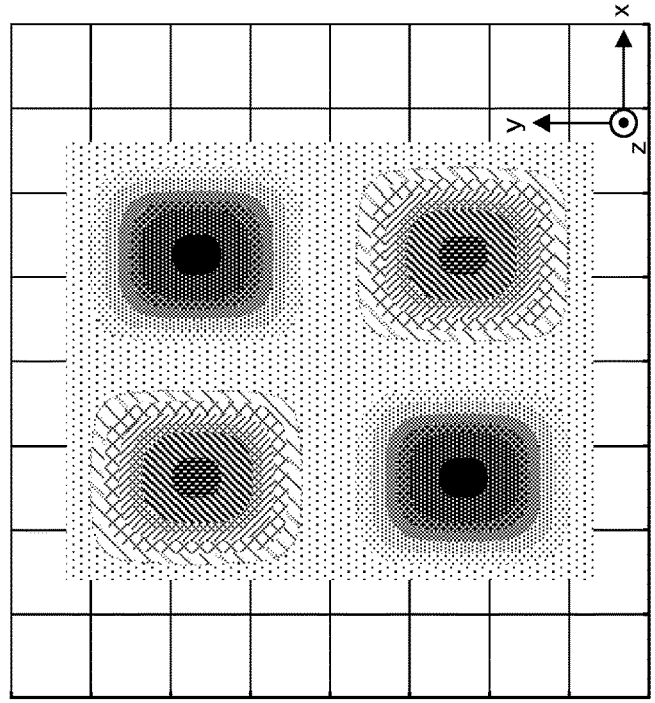
FIGS. 7A and 7B are diagrams showing a relationship between a distribution of an imprint material and a positional deviation.
Figure 7B:
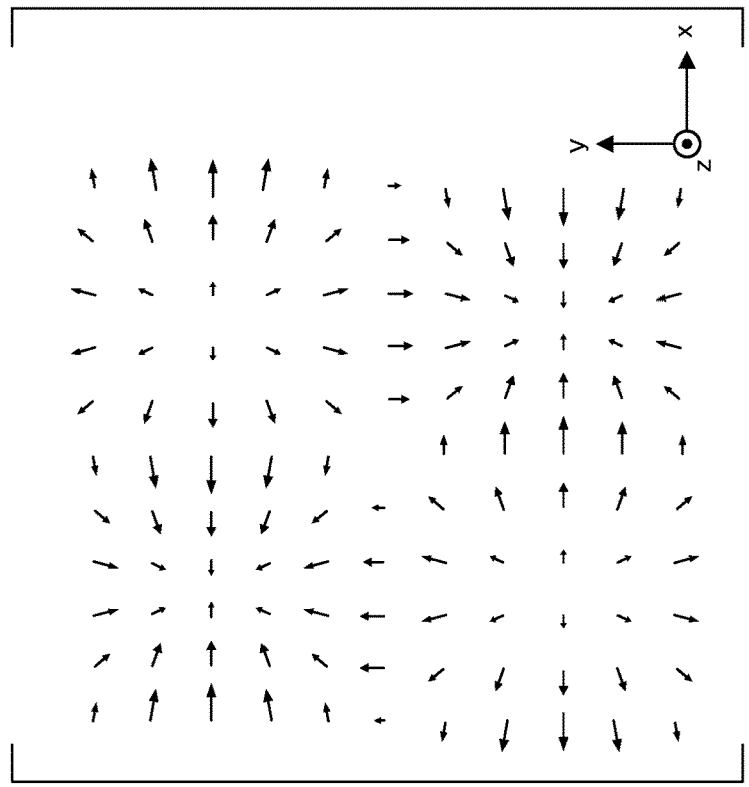

FIG. 7 is a diagram showing a relationship between a distribution of an imprint material and a positional deviation. FIG. 7A shows a state where the density of an imprint material is distributed. In FIG. 7B, positional deviations of a substrate and a mold at the time of performing imprinting on an imprint material having a distribution are indicated by arrows. These positional deviations occur because the shape of the mold when pressed changes depending on the density of the imprint material. As shown in the drawing, positional deviations of the substrate and the mold occur toward a location having a relatively low density (thickness) of the imprint material from a location having a relatively high density of the imprint material. Accordingly, in S4, the control unit 17 determines the amount of imprint material to be supplied and the disposition of the imprint material to be supplied onto the substrate on the basis of the level difference amount calculated in S3.

In S5, the imprint material having the supply amount and disposition determined in S4 is supplied onto the substrate by the supply unit 21 including a dispenser.

Meanwhile, a drop disposition method for a positional deviation shape of a target to be corrected is obtained in advance by simulation or a preliminary experiment and is stored in, for example, the storage unit of the control unit 17. The correction of a positional deviation which is performed in accordance with a density distribution of the imprint material may be used simultaneously with the shape correction in S6 or may be used independently. In a case where the correction is used independently, the process of S6 is omitted. Thereafter, the mold holding portion 12 descends, and the mold 11 is pressed against the imprint material on the substrate 13. Meanwhile, for a specific method of correcting a positional deviation by imparting a distribution to the disposition of the imprint material which is performed in S5, refer to U.S. Ser. No. 15/162,130.

According to the present example, it is possible to correct positional deviations of the substrate and the mold without configuring a shape correction unit. In addition, it is possible to more flexibly correct positional deviations of the substrate and the mold by using the shape correction unit in combination and further improve the accuracy of alignment of the mold and the substrate.

Embodiment of Article Manufacturing Method

A pattern of a cured material formed using an imprint apparatus is used permanently on at least some of various commodities or used temporarily when various commodities are manufactured. The article is an electric circuit element, an optical element, an MEMS, a recording element, a sensor, a mold, or the like. Examples of the electric circuit element include volatile or non-volatile semiconductor memories such as a DRAM, an SRAM, a flash memory, and an MRAM, semiconductor elements such as an LSI, a CCD, an image sensor, and an FPGA, and the like. Examples of the mold include a mold for imprinting, and the like.

The pattern of the cured material is used as it is as a constituent member of at least a portion of the article or is used temporarily as a resist mask. After etching, ion implantation, and the like are performed in a wafer processing step, the resist mask is removed.

Figure 8A:
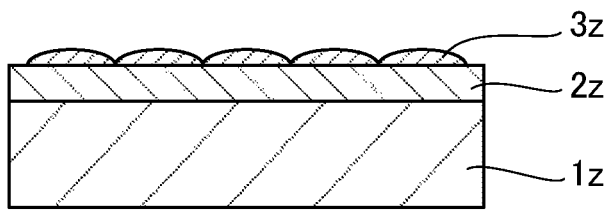
FIGS. 8A to 8F are diagrams showing an article manufacturing method.

Next, a specific article manufacturing method will be described. As shown in FIG. 8A, a wafer 1z such as a silicon wafer having a surface on which a material 2z to be processed such as an insulator is formed is prepared, and subsequently, an imprint material 3z is applied to the surface of the material 2z to be processed by an ink jet method or the like. Here, a state where the imprint material 3z in the form of a plurality of droplets is applied onto the wafer is shown.

Figure 8B:
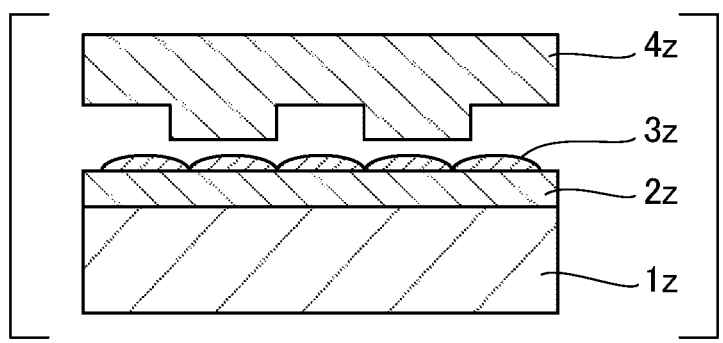
Figure 8C:
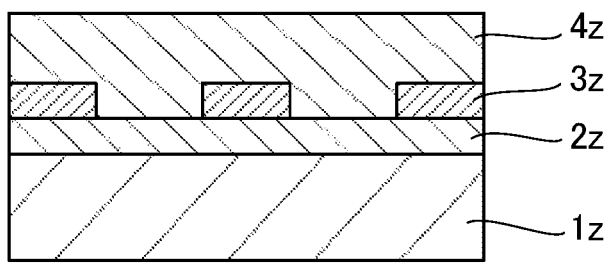

As shown in FIG. 8B, a mold 4z for imprinting is configured such that a side having an irregular pattern formed therein faces the imprint material 3z on the wafer. As shown in FIG. 8C, the wafer 1z having the imprint material 3z applied thereto and the mold 4z are brought into contact with each other, and pressure is applied. The imprint material 3z is filled between a gap between the mold 4z and the material 2z to be processed. When light is emitted through the mold 4z as energy for curing in this state, the imprint material 3z is cured.

Figure 8D:
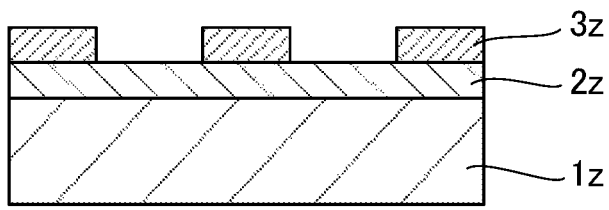

As shown in FIG. 8D, when the mold 4z and the wafer 1z are separated from each other after curing the imprint material 3z, a pattern of a cured material of the imprint material 3z is formed on the wafer 1z. The pattern of the cured material has a shape in which a concave portion of the mold corresponds to a convex portion of the cured material, that is, the irregular pattern of the mold 4z is transferred to the imprint material 3z.

Figure 8E:
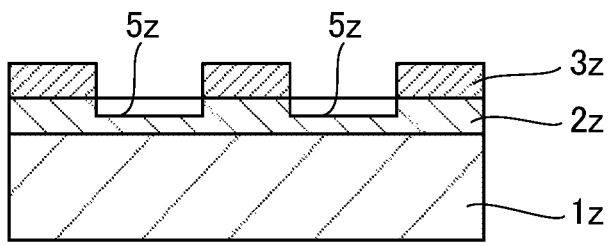
Figure 8F:
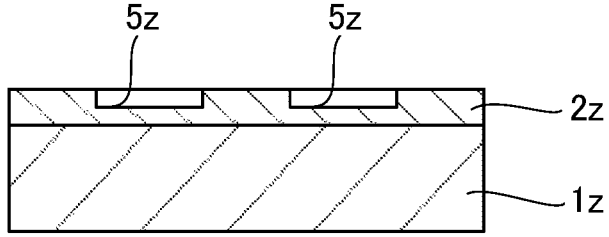

As shown in FIG. 8E, when etching is performed using the pattern of the cured material as an etching resistant mask, a portion having no cured material or having a remaining thin cured material on the surface of the material 2z to be processed is removed, which becomes a groove 5z. As shown in FIG. 8F, when the pattern of the cured material is removed, an article in which the groove 5z is formed on the surface of the material 2z to be processed can be obtained. Although the pattern of the cured material has been removed here, the pattern of the cured material may not be removed even after processing and may be used as, for example, a film for an insulating interlayer included in a semiconductor element or the like, that is, a constituent member of the article.

Other Embodiments

Although the preferred embodiments of the present invention have been described, the present invention is not limited to those embodiments, and various modifications and changes can be made without departing from the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-197745, filed on Oct. 302019, which is hereby incorporated by reference wherein in its entirety.

What is claimed is:

1. An imprint apparatus that forms a pattern in an imprint material on a substrate by bringing the imprint material and a mold into contact with each other, the imprint apparatus comprising:
   a measurement unit configured to measure a partial surface shape of a predetermined partial shot region of the substrate;
   a control unit configured to acquire a correction amount for relative positional deviations of the substrate and the mold which occur while the imprint material and the mold are brought into contact with each other, based on the partial surface shape of the predetermined partial shot region which is measured by the measurement unit; and
   a shape correction unit configured to correct a shape of at least one of the substrate and the mold based on the correction amount,
   wherein the control unit acquires the correction amount for the other shot regions of the substrate based on the partial surface shape of the predetermined partial shot region which is measured by the measurement unit.

2. The imprint apparatus according to claim 1, wherein the control unit acquires a surface level difference amount of the entire substrate based on a surface shape of the predetermined partial shot region which is measured by the measurement unit, and acquires the correction amount for the entire substrate based on the surface level difference amount.

3. The imprint apparatus according to claim 2, wherein the control unit includes a storage unit configured to store information indicating a relationship between the surface level difference amount and an amount of the positional deviation in advance, and acquire the correction amount using the stored information.

4. The imprint apparatus according to claim 1, wherein
the measurement unit measures a surface shape of a portion in one shot region, and
the control unit acquires a surface level difference amount of the entire substrate based on the surface shape of the portion in the shot region.

5. The imprint apparatus according to claim 1, wherein
the measurement unit measures surface shapes of a plurality of portions in one shot region, and
the control unit acquires a surface level difference amount of the entire one shot region by interpolating information of the shapes of the plurality of portions, and acquires a surface level difference amount of the entire substrate based on the surface level difference amount of the entire one shot region.

6. The imprint apparatus according to claim 1, wherein
the measurement unit measures respective partial surface shapes in a plurality of shot regions, and
the control unit acquires a surface level difference amount of the entire substrate by interpolating information of the respective surface shapes in the plurality of shot regions.

7. The imprint apparatus according to claim 1, wherein the control unit acquires the correction amount using an amount of the positional deviation in an entire shot region which is measured in advance and coordinates on a shot region at each of points where the amount of the positional deviation is measured.

8. The imprint apparatus according to claim 1, wherein the control unit determines a portion for measuring the surface shape based on surface shape information of an entire shot region which is prepared in advance.

9. The imprint apparatus according to claim 1, wherein the shape correction unit changes a shape of the mold by applying a force to a side surface of the mold.

10. The imprint apparatus according to claim 1, wherein the shape correction unit changes a shape of at least one of the substrate and the mold by irradiating at least one of the substrate and the mold with light different from light for curing the imprint material or heat.

11. The imprint apparatus according to claim 1, further comprising:
a supply unit configured to supply the imprint material to the substrate,
wherein the control unit determines an amount of the imprint material to be supplied and disposition of an imprint material to be supplied to the substrate, based on the correction amount.

12. An imprint method for forming a pattern in an imprint material positioned on a substrate by bringing the imprint material and a mold into contact with each other, the imprint method comprising:
measuring a partial surface shape of a predetermined partial shot region of the substrate; and
acquiring a correction amount for relative positional deviations of the substrate and the mold which occur while the imprint material and the mold are brought into contact with each other, based on the measured partial surface shape of the predetermined partial shot region, and correcting a shape of at least one of the substrate and the mold based on the correction amount,
wherein the correcting of the shape includes acquiring the correction amount for the other shot regions of the substrate based on the measured partial surface shape of the predetermined partial shot region.

13. An article manufacturing method comprising:
forming a pattern on a substrate using an imprint apparatus that forms the pattern in an imprint material positioned on the substrate by bringing the imprint material and a mold into contact with each other;
processing the substrate having the pattern formed thereon; and
manufacturing an article from the processed substrate,
wherein the imprint apparatus includes
a measurement unit configured to measure a partial surface shape of a predetermined partial shot region of the substrate,
a control unit configured to acquire a correction amount for relative positional deviations of the substrate and the mold which occur while the imprint material and the mold are brought into contact with each other, based on the partial surface shape of the predetermined partial shot region which is measured by the measurement unit, and
a shape correction unit configured to correct a shape of at least one of the substrate and the mold based on the correction amount, and
the control unit acquires the correction amount for the other shot regions of the substrate based on the partial surface shape of the predetermined partial shot region which is measured by the measurement unit.

* * * * *